(12) United States Patent
He et al.

(10) Patent No.: US 10,665,815 B2
(45) Date of Patent: May 26, 2020

(54) NATURALLY DISCONTINUOUS DISPLAY MOTHER-SUBSTRATE AND METHOD OF MANUFACTURING THE SAME, DISPLAY SUBSTRATE AND DISPLAY APPARATUS

(71) Applicant: BOE TECHNOLOGY GROUP CO., LTD., Beijing (CN)

(72) Inventors: Fang He, Beijing (CN); Shi Shu, Beijing (CN); Chuanxiang Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/218,910

(22) Filed: Dec. 13, 2018

(65) Prior Publication Data
US 2019/0288231 A1   Sep. 19, 2019

(30) Foreign Application Priority Data

Mar. 14, 2018   (CN) .......................... 2018 1 0209611

(51) Int. Cl.
*H01L 51/52*       (2006.01)
*H01L 51/56*       (2006.01)
*H01L 27/32*       (2006.01)
*H01L 51/00*       (2006.01)

(52) U.S. Cl.
CPC ........ *H01L 51/525* (2013.01); *H01L 27/3246* (2013.01); *H01L 51/0096* (2013.01); *H01L 51/5253* (2013.01); *H01L 51/56* (2013.01)

(58) Field of Classification Search
CPC ... H01L 51/525; H01L 51/56; H01L 51/5253; H01L 51/0096; H01L 27/3246; H01L 27/3244
See application file for complete search history.

(56) References Cited

U.S. PATENT DOCUMENTS

| | | | |
|---|---|---|---|
| 7,880,384 B2* | 2/2011 | Kwak | H01L 27/3276 313/512 |
| 2014/0097430 A1* | 4/2014 | Park | H01L 27/1218 257/48 |
| 2016/0026019 A1* | 1/2016 | Choi | G02F 1/133514 428/189 |

* cited by examiner

*Primary Examiner* — Tracie Y Green
(74) *Attorney, Agent, or Firm* — Nath, Goldberg & Meyer; Joshua B. Goldberg

(57) ABSTRACT

The present application provides display mother-substrate, method of manufacturing display mother-substrate, display substrate and display apparatus. The display mother-substrate is configured to be cut along cutting line to obtain display substrate, has display area and non-display area, and includes: a base substrate; a plurality of light emitting elements on the base substrate and in the display area; an encapsulation layer for encapsulating the plurality of the light emitting elements on a side of the plurality of light emitting elements away from the base substrate and in both of the display area and the non-display area; a spacer component in the non-display area and on a side of the encapsulation layer close to the base substrate. At least a part of the spacer component is between the cutting line and the display area. The encapsulation layer is discontinuous at a position between the cutting line and the display area.

20 Claims, 5 Drawing Sheets

NATURALLY DISCONTINUOUS DISPLAY MOTHER-SUBSTRATE AND METHOD OF MANUFACTURING THE SAME, DISPLAY SUBSTRATE AND DISPLAY APPARATUS

CROSS-REFERENCE TO RELATED APPLICATION

This application claims priority to Chinese Patent Application No. 201810209611.5, filed on Mar. 14, 2018, the entire contents of which are hereby incorporated by reference.

TECHNICAL FIELD

The present disclosure relates to the field of display technology, and particularly, to a display mother-substrate, a method of manufacturing a display mother-substrate, a display substrate and a display apparatus.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than typical LCD apparatuses. An OLED display apparatus typically includes an anode, an organic functional layer including an organic light emitting layer, and a cathode. OLEDs can be either a bottom-emission type OLED or a top-emission type OLED. Typically, an OLED display substrate can be obtained by cutting an OLED display mother-substrate along a cutting line.

SUMMARY

In an aspect, the present disclosure provides a display mother-substrate configured to be cut along a cutting line to obtain a display substrate, the display mother-substrate having a display area and a non-display area. The display mother-substrate includes a base substrate; a plurality of light emitting elements on the base substrate and in the display area; an encapsulation layer for encapsulating the plurality of the light emitting elements on a side of the plurality of light emitting elements away from the base substrate and in both of the display area and the non-display area; a spacer component in the non-display area and on a side of the encapsulation layer close to the base substrate; wherein at least a part of the spacer component is between the cutting line and the display area, and the encapsulation layer is discontinuous at a position between the cutting line and the display area.

In some embodiments, the encapsulation layer includes a first portion in the display area and a second portion on a side of the spacer component away from the base substrate, and the first portion and the second portion are spaced apart from each other such that the encapsulation layer is discontinuous at a position between the spacer component and the display area.

In some embodiments, the spacer component is arranged substantially along the cutting line and substantially surrounds the display area.

In some embodiments, a cross-section of the spacer component along a width direction of the spacer component from the display area to the non-display area has a trapezoid shape, an inverted trapezoid shape, or a rectangular shape.

In some embodiments, an orthographic projection of the cutting line on the base substrate is within an orthographic projection of the spacer component on the base substrate.

In some embodiments, an orthographic projection of the cutting line on the base substrate is outside an orthographic projection of the spacer component on the base substrate.

In some embodiments, the encapsulation layer is discontinuous at a position between the spacer component and the cutting line.

In some embodiments, the display mother-substrate further includes a spacer layer in the display area, and the spacer component and the spacer layer are made of a same material.

In some embodiments, the display mother-substrate further includes a planarization layer in the display area; and a spacer layer on a side of the planarization layer away from the base substrate, wherein the spacer component includes a first structural layer and a second structural layer arranged sequentially along a direction from the base substrate to the encapsulation layer; the first structural layer and the planarization layer are in a same layer and made of a same material; and the second structural layer and the spacer layer are in a same layer and made of a same material.

In some embodiments, the cross-section has a bottom close to the base substrate and a top away from the base substrate; an orthographic projection of the top on the base substrate has a first end and a second end; and an orthographic projection of the bottom on the base substrate has a third end and a fourth end; wherein at least one of the third end and the fourth end is between the first end and the second end.

In some embodiments, the cross-section further has a first side and a second side opposite to each other for connecting the top and the bottom; wherein the top is substantially parallel to the base substrate; and at least one of a first included angle between the top and the first side and a second included angle between the top and the second side is less than 90°.

In some embodiments, the display mother-substrate has a plurality of display areas, and the spacer component between adjacent display areas is of an integral structure.

In another aspect, the present disclosure further provides a method of manufacturing a display mother-substrate, the display mother-substrate being configured to be cut along a cutting line to obtain a display substrate, the display mother-substrate having a display area and a non-display area. The method includes forming a base substrate; forming a plurality of light emitting elements on the base substrate and in the display area; forming an encapsulation layer on a side of the plurality of light emitting elements away from the base substrate and in both of the display area and the non-display area, the encapsulation layer in the display area being formed to encapsulate the plurality of light emitting elements; wherein prior to forming the encapsulation layer, the method further includes forming a spacer component in the non-display area and on a side of the encapsulation layer to be formed close to the base substrate; at least a part of the spacer component is formed between the cutting line and the display area, and the encapsulation layer is formed to be discontinuous at a position between the cutting line and the display area.

In some embodiments, the encapsulation layer is formed to include a first portion in the display area and a second portion on a side of the spacer component away from the base substrate, and the first portion and the second portion are formed to be spaced apart from each other such that the encapsulation layer is discontinuous at a position between the spacer component and the display area.

In some embodiments, the spacer component is formed so that the spacer component is arranged substantially along the cutting line and substantially surrounds the display area.

In some embodiments, the spacer component is formed so that a cross-section of the spacer component along a width direction of the spacer component from the display area to the non-display area has a trapezoid shape, an inverted trapezoid shape, or a rectangular shape.

In some embodiments, the method further includes forming a spacer layer in the display area, wherein the spacer component and the spacer layer are formed by using a same material.

In some embodiments, the method further includes forming a planarization layer in the display area; and forming a spacer layer on a side of the planarization layer away from the base substrate, wherein the spacer component is formed to include a first structural layer and a second structural layer arranged sequentially along a direction from the base substrate to the encapsulation layer; the first structural layer and the planarization layer are formed in a same layer by using a same material; and the second structural layer and the spacer layer are formed in a same layer by using a same material.

In another aspect, the present disclosure provides a display substrate, the display substrate being obtained by cutting, along a cutting line, the display mother-substrate described herein or manufactured by the method described herein.

In another aspect, the present disclosure further provides a display apparatus, including the display substrate described herein.

DETAILED DESCRIPTION

Figure 1:
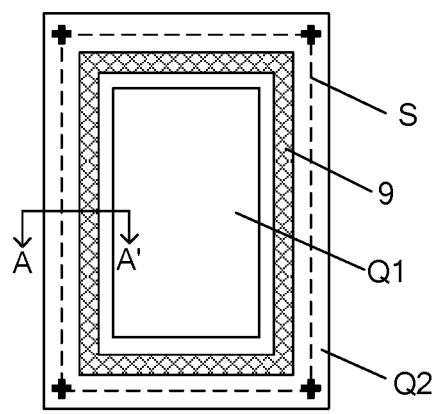
FIG. 1 is a partial plan view of a display mother-substrate in some embodiments according to the present disclosure.

To make those skilled in the art better understand the technical solution of the present disclosure, the present disclosure will be described in detail below in conjunction with the accompanying drawings and specific embodiments.

As used herein, expressions such as "first", "second", and the like are not intended to imply any orders, numbers or importance, but are used for distinguishing different parts. Expressions such as "include", "comprise", or the like, when preceding a list of elements or items or the like, means that an element or item preceding the expression encompasses the list of the elements or items or the like, but may also includes other elements or items. Terms such as "up" and "down" are only used for expressing a relative positional relationship, and when an absolute position of the described object is changed, the relative positional relationship may also changed accordingly.

OLED devices (including a first electrode, an organic functional layer, and a second electrode) are provided on the display mother-substrate, and the organic light emitting material and the cathode material in the OLED devices are especially sensitive to oxygen and moisture. Thus, an encapsulation layer is provided to encapsulate the OLED devices to prevent the oxygen and moisture from being permeating into the OLED devices.

It has been discovered in the present disclosure that, the encapsulation layer (in particular, the inorganic encapsulation sub-layer) is prone to be damaged when the display mother-substrate is cut along a cutting line to produce a display substrate. Accordingly, cracks generated in the encapsulation layer are very likely to extend to the display area of the display substrate, resulting in that the OLED devices cannot be encapsulated well, thereby degrading the reliability of the display substrate.

Accordingly, the present disclosure provides, inter alia, a display mother-substrate, a method of manufacturing a display mother-substrate, a display substrate and a display apparatus that substantially obviate one or more of the problems due to limitations and disadvantages of the related art.

In one aspect, the present disclosure provides a display mother-substrate configured to be cut along a cutting line to obtain a display substrate, the display mother-substrate having a display area and a non-display area. The display mother-substrate includes a base substrate; a plurality of light emitting elements on the base substrate and in the display area; an encapsulation layer for encapsulating the plurality of the light emitting elements on a side of the plurality of light emitting elements away from the base substrate and in both of the display area and the non-display area; and a spacer component in the non-display area and on a side of the encapsulation layer close to the base substrate. In some embodiments, at least a part of the spacer component is between the cutting line and the display area, and the encapsulation layer is discontinuous at a position between the cutting line and the display area.

As used herein, the term "display area" refers to an area of a display substrate (e.g., a counter substrate or an array substrate) in a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emitting layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein the term "non-display area" refers to an area of a display substrate (e.g., a counter substrate or an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the non-display area rather than in the display areas. In the present disclosure, a cutting line is provided in the non-display area of the display mother-substrate, and one or more display substrates can be obtained by cutting the display mother-substrate along the cutting line.

As used herein the term "substantially surrounding" refers to surrounding at least 50% (e.g., at least 60%, at least 70%, at least 80%, at least 90%, at least 95%, at least 99%, and 100%) of a perimeter of an area.

Figure 2:
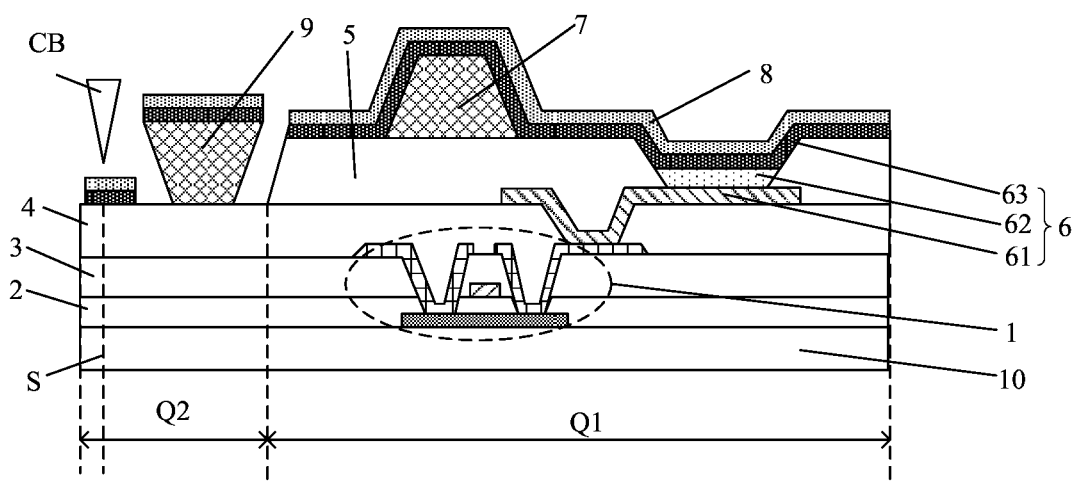
FIG. 2 is a cross-sectional view taken along line A-A' in FIG. 1.
Figure 3:
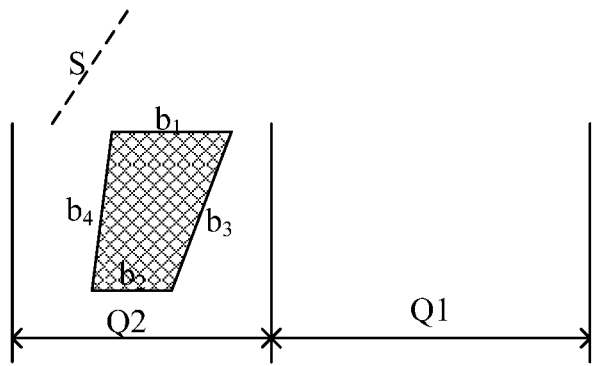
FIG. 3 to FIG. 5 are cross-sectional views of a spacer component taken along line A-A' in FIG. 1.
Figure 4:
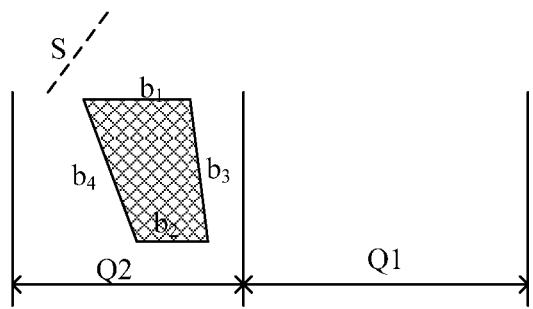
Figure 5:
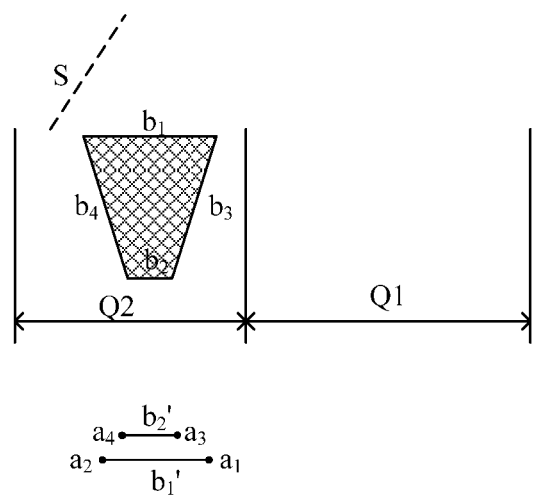

FIG. 1 is a partial plan view of a display mother-substrate in some embodiments according to the present disclosure. FIG. 2 is a cross-sectional view taken along line A-A' in FIG. 1. FIG. 3 to FIG. 5 are cross-sectional views of a spacer component along line A-A' in FIG. 1.

Referring to FIGS. 1 to 5, in some embodiments, the display mother-substrate has a display area Q1 and a non-display area Q2, and the display mother-substrate is configured to be cut along a cutting line S to obtain a display substrate. The display mother-substrate includes a base substrate 10; a plurality of light emitting elements 6 on the base substrate 10 and in the display area Q1; an encapsulation layer 8 for encapsulating the plurality of the light emitting elements 6 on a side of the plurality of light emitting elements 6 away from the base substrate 10 and in both of the display area Q1 and the non-display area Q2. The display mother-substrate further includes a spacer component 9 in the non-display area Q2 and on a side of the encapsulation layer 8 close to the base substrate 10. At least a part of the spacer component 9 is between the cutting line S and the display area Q1, and the encapsulation layer 8 is discontinuous at a position between the cutting line S and the display area Q1.

In some embodiments, the light emitting element is an organic light emitting diode (OLED).

In some embodiments, the encapsulation layer includes a first portion in the display area and a second portion on a side of the spacer component away from the base substrate, and the first portion and the second portion are spaced apart from each other such that the encapsulation layer is discontinuous at the position between the spacer component and the display area.

In the embodiments, by having the spacer component 9 in the non-display area Q2 and between the base substrate 10 and the encapsulation layer 8, the encapsulation layer 8 can be made discontinuous between the display area Q1 and the cutting line S. For example, during formation of the encapsulation layer 8 after the formation of the spacer component 9, the encapsulation layer 8 is naturally discontinuous at an edge of the spacer component 9 due to the presence of the spacer component 9, and a discontinuous encapsulation layer is thus formed. Accordingly, before cutting the display mother-substrate, the encapsulation layer 8 of the display mother-substrate is already discontinuous at a position between the display area Q1 and the cutting line S. Therefore, when the display mother-substrate is cut along the cutting line to obtain the display substrate in a subsequent process, cracks generated in the encapsulation layer 8 in the non-display area Q2 caused by the cutting will not extend to the encapsulation layer 8 in the display area Q1, thereby effectively improving the reliability of the display substrate obtained by the cutting.

As used herein, the term "naturally discontinuous" or "naturally cracked" or the like means that the discontinuous structure obtained as a result of a process naturally appears, but the discontinuous structure is not obtained as a result of an additional or specific process or by an external force. For example, when depositing a encapsulation layer material to form the encapsulation layer, the deposited encapsulation layer material is made naturally discontinuous at a position between the spacer component and the display area due to the presence of the spacer component (e.g., there is a gap or segment difference between the encapsulation layer in the display area and the encapsulation layer in the non-display area), and such discontinuity is naturally formed in the deposition process, rather than formed through an additional or specific process or by an external force.

It should be noted that FIG. 1 only illustrates the display mother-substrate including one display substrate therein, but the present disclosure is not limited thereto. The display mother-substrate may include one or a plurality of display substrates. When the display mother-substrate includes a plurality of display substrates, the plurality of display substrates may be arranged in the display mother-substrate in row(s) and/or column(s).

It should be also noted that the stress applied, when the encapsulation layer 8 is formed above a layer where the spacer component 9 is located such that the encapsulation layer 8 is naturally discontinuous (e.g., naturally cracked) at a position (e.g., at an edge of the spacer component 9) between the display area Q1 and the cutting line S, onto the encapsulation layer 8 at the edge of the spacer component 9 is much less than the stress applied onto the encapsulation layer 8 by a cutting blade CB when cutting the display mother-substrate. That is to say, by having the spacer component 9 to make the encapsulation layer 8 naturally discontinuous at a position (e.g., at the edge of the spacer component 9) between the display area Q1 and the cutting line S, basically no cracks will be generated in the discontinued position of the encapsulation layer 8, and even in a case where a crack is generated, the crack will not extend into the encapsulation layer 8 in the display area Q1.

In the present disclosure, the spacer component 9 may be designed to have a wall shape or a strip shape. In some embodiments, the spacer component 9 is provided to surround the display area Q1, such that the encapsulation layer 8 can be formed to be discontinuous at every position between the display area Q1 and the cutting line S, thereby ensuring to the largest extent that the crack generated when cutting the encapsulation layer 8 is prevented from extending to the display area Q1.

In some embodiments, the spacer component is arranged substantially along the cutting line and substantially surrounds the display area. As illustrated in FIG. 1, in some embodiments, the spacer component 9 is arranged substantially along the cutting line S and substantially surrounds the display area Q1.

The spacer component includes a bottom surface close to the base substrate and a top surface away from the base substrate. In some embodiment, an orthographic projection of the cutting line on the base substrate is within an orthographic projection of the spacer component on the base substrate. In some embodiment, the orthographic projection of the cutting line on the base substrate is outside the orthographic projection of the spacer component on the base substrate. In some embodiment, the orthographic projection of the cutting line on the base substrate is outside an orthographic projection of the top surface of the spacer component on the base substrate and within an orthographic projection of the bottom surface of the spacer component on the base substrate. In some embodiment, the orthographic projection of the cutting line on the base substrate is within the orthographic projection of the top surface of the spacer component on the base substrate. Needless to say, the positional relationship between the spacer component 9 and the cutting line S can also be flexibly designed based on the specific shape and size of the spacer component 9, as long as the encapsulation layer in the display area Q1 will not be affected during the cutting.

In some embodiments and referring to FIG. 1, the spacer component 9 is between the display area Q1 and the cutting line S of the display mother-substrate. The spacer component 9 may have various structures.

In some embodiments and referring to FIG. 3, a cross-section of the spacer component 9 along a width direction (i.e., A-A' in FIG. 1) of the spacer component 9 from the display area Q1 to the non-display area Q2 has a bottom $b_2$ close to the base substrate 10 and a top $b_1$ away from the base substrate 10; and a first side $b_3$ and a second side $b_4$ opposite to each other and connecting the top $b_1$ and the bottom $b_2$. An orthographic projection of the top b1 on the base substrate 10 is denoted as a first projection $b_1'$; and an orthographic projection of the bottom $b_2$ on the base substrate 10 is denoted as a second projection $b_2'$. The first projection $b_1'$ has a first end $a_1$ and a second end $a_2$, and the second projection $b_2'$ has a third end $a_3$ and a fourth end $a_4$. As illustrated in FIG. 3, the third end $a_3$ of the second projection $b_2'$ is within the first projection $b_1'$, and the fourth end $a_4$ is not within the first projection $b_1'$. That is to say, an included angle between the side surface of the spacer component 9 close to the display area Q1 and the top surface of the spacer component 9 is equal to or less than 90°. By having this included angle, the encapsulation layer 8 deposited on the spacer component 9 can be made naturally discontinuous at the position of the included angle. Therefore, when the display mother-substrate is cut along the cutting line S to obtain the display substrate in a subsequent process, cracks generated in the encapsulation layer 8 in the non-display area Q2 will not extend to the encapsulation layer 8 in the display area Q1, thereby effectively improving the reliability of the display substrate obtained by the cutting.

Here, it should be noted that the first projection $b_1'$ and the second projection $b_2'$ illustrated in FIG. 3 actually overlap each other. They are separately shown in the figure to clearly illustrate sizes of the first projection $b_1'$ and the second projection $b_2'$ and relationship among the first end $a_1$, the second end $a_2$, the third end $a_3$, and the fourth end $a_4$. The same is applied to the illustration of the first projection $b_1'$ and the second projection $b_2'$ in FIGS. 4, 5 and 7.

Further, in the present disclosure, the shape (a shape in a plan view such as FIG. 1) of the spacer component 9 may be of a linear shape, or a non-linear shape such as a zigzag shape or a curved shape. In a case where the spacer component 9 is of a linear shape, the width direction of the spacer component 9 is a width direction of the line. In a case where the spacer component 9 is of a zigzag shape, the width direction of the spacer component 9 is a width direction of each line segment. In a case where the spacer component 9 is of a curved shape, the width direction of the spacer component 9 is a width direction of the curved line. In the embodiments of the present disclosure, for ease of description, a linear shape is taken as the shape of the spacer component 9 by way of example, but this should not be construed as limitation to the present disclosure.

In some embodiments and referring to FIG. 3, the top $b_1$ of the spacer component 9 is parallel to the base substrate 10. The first side $b_3$ and the second side $b_4$ of the cross-section in FIG. 3 are linear sides, and an included angle between the top $b_1$ and the first side $b_3$ is less than 90°. Accordingly, an included angle between the side surface of the spacer component 9 close to the display area Q1 and the top surface of the spacer component 9 can be made sharper, thereby ensuring that the encapsulation layer 8 deposited on the spacer component 9 can be made naturally discontinuous at this position. Moreover, the spacer component 9 having this structure can be easily fabricated.

In some embodiments, the included angle between the top $b_1$ and the first side $b_3$ of the cross-section of the spacer component 9 is equal to approximately 70°. As such, by having the included angle of 70°, the encapsulation layer 8 deposited on the spacer component 9 can be made completely and naturally discontinuous, and the spacer component 9 having this structure can also be easily fabricated.

In some embodiments, as illustrated in FIG. 4, the spacer component 9 has a similar structure as that illustrated in FIG. 3. The difference lies in that, the fourth end $a_4$ of the second projection $b_2'$ is within the first projection $b_1'$, and the third end $a_3$ is not within the first projection $b_1'$. That is to say, an included angle between the side surface of the spacer component 9 close to the cutting line S and the top surface of the spacer component 9 is equal to or less than 90°. By having this included angle, the encapsulation layer 8 deposited on the spacer component 9 can be made naturally discontinuous at the position of the included angle. Therefore, when the display mother-substrate is cut along the cutting line S to obtain the display substrate in a subsequent process, cracks generated in the encapsulation layer 8 in the non-display area Q2 will not extend to the encapsulation layer 8 in the display area Q1, thereby effectively improving the reliability of the display substrate obtained by the cutting.

In some embodiments and referring to FIG. 4, the top $b_1$ of the spacer component 9 is parallel to the base substrate 10. The first side $b_3$ and the second side $b_4$ of the cross-section in FIG. 4 are linear sides, and an included angle between the top $b_1$ and the second side $b_4$ is less than 90°. Accordingly, an included angle between the side surface of the spacer component 9 close to the cutting line S and the top surface of the spacer component 9 can be made sharper, thereby ensuring that the encapsulation layer 8 deposited on the spacer component 9 can be made naturally discontinuous at this position. Moreover, the spacer component 9 having this structure can be easily fabricated.

In some embodiments, the included angle between the top $b_1$ and the second side $b_4$ of the cross-section of the spacer component 9 is equal to approximately 70°. As such, by having the included angle of 70°, the encapsulation layer 8 deposited on the spacer component 9 can be made completely and naturally discontinuous, and the spacer component 9 having this structure can also be easily fabricated.

In some embodiments, as illustrated in FIG. 5, the spacer component 9 has a similar structure as those illustrated in FIGS. 3 and 4. The difference lies in that, each of the third end $a_3$ and the fourth end $a_4$ of the second projection $b_2'$ is within the first projection $b_1'$. That is to say, an included angle between the side surface of the spacer component 9 close to the display area Q1 and the top surface of the spacer component 9 is equal to or less than 90°, and an included angle between the side surface of the spacer component 9 close to the cutting line S and the top surface of the spacer component 9 is equal to or less than 90°. By having these two included angles, the encapsulation layer 8 deposited on the spacer component 9 can be made naturally discontinuous at the positions of the included angles. Therefore, when the display mother-substrate is cut along the cutting line S to obtain the display substrate in a subsequent process, cracks generated in the encapsulation layer 8 in the non-display area Q2 will not extend to the encapsulation layer 8 in the display area Q1, thereby effectively improving the reliability of the display substrate obtained by the cutting.

In some embodiments and referring to FIG. 5, the top $b_1$ of the spacer component 9 is parallel to the base substrate 10. The first side $b_3$ and the second side $b_4$ of the cross-section in FIG. 5 are linear sides, an included angle between the top $b_1$ and the first side $b_3$ is less than 90°, and an included angle between the top $b_1$ and the second side $b_4$ is also less than 90°. Accordingly, an included angle between the side surface of the spacer component 9 close to the cutting line S and the top surface of the spacer component 9 and an included angle between the side surface of the spacer component 9 close to the display area Q1 and the top surface of the spacer component 9 can be made sharper, thereby ensuring that the encapsulation layer 8 deposited on the spacer component 9 can be made naturally discontinuous at these positions. Moreover, the spacer component 9 having this structure can be easily fabricated.

In some embodiments, the included angle between the top $b_1$ and the first side $b_3$ of the cross-section of the spacer component 9 is equal to approximately 70° and the included angle between the top $b_1$ and the second side $b_4$ of the cross-section of the spacer component 9 is equal to 70°. As such, by having the included angles of 70°, the encapsulation layer 8 deposited on the spacer component 9 can be made completely and naturally discontinuous, and the spacer component 9 having this structure can also be easily fabricated.

Here, it should be noted that each of the cross-sections illustrated in FIGS. 3 to 5 are for illustrative purpose only, but should not be construed as limitation to the present disclosure. The cross-section may be of a parallelogram shape or a rectangular shape, which can also make the encapsulation layer 8 deposited on the spacer component 9 naturally discontinuous (e.g., naturally cracked).

Figure 6:
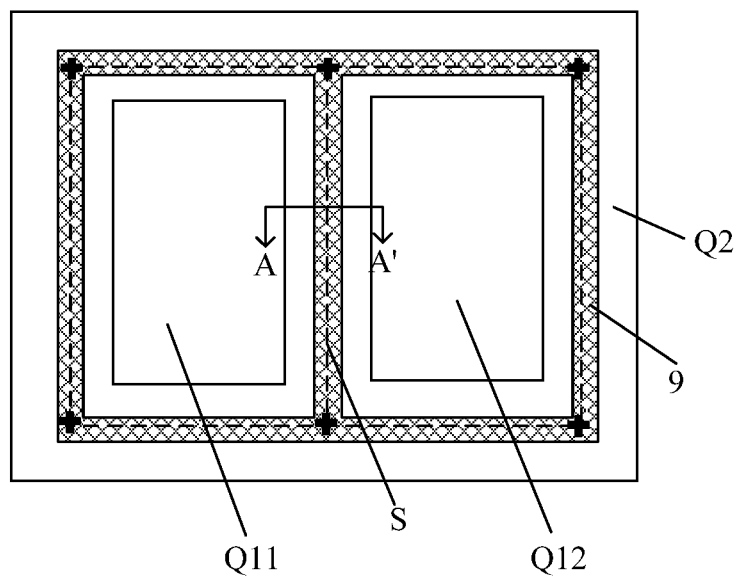
FIG. 6 is a partial plan view of a display mother-substrate in some embodiments according to the present disclosure.
Figure 7:
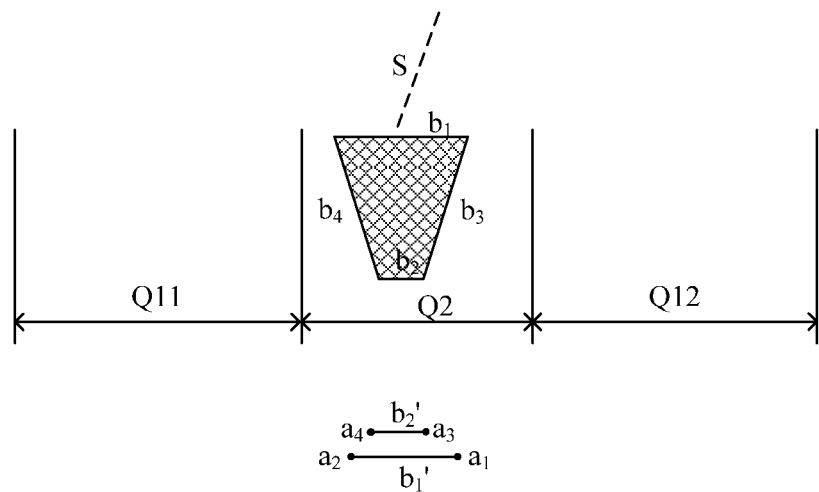
FIG. 7 is a cross-sectional view of a spacer component taken along line A-A' in FIG. 6.

FIG. 6 is a partial plan view of a display mother-substrate in some embodiments according to the present disclosure, and FIG. 7 is a cross-sectional view of a spacer component taken along line A-A' in FIG. 6. As illustrated in FIG. 6, in some embodiments, an orthographic projection of the spacer component 9 on the base substrate 10 covers the cutting line S. That is, an orthographic projection of the cutting line S on the base substrate 10 is within the orthographic projection of the spacer component 9 on the base substrate 10. This arrangement is suitable for the display mother-substrate having a plurality of display areas Q1. In some embodiments, adjacent display areas Q1 share a same spacer component 9. In some embodiments, the spacer components for the respective display areas of the display mother-substrate may be of an integral structure. As such, the manufacturing process of the display mother-substrate can be simplified. Because the adjacent display areas share a same spacer component 9, the spacer component 9 having the cross-section as illustrated in FIG. 5 may be adopted so that the encapsulation layer 8 is cracked between the cutting line S and the display area Q1 before the cutting.

Next, descriptions will be given with reference to an example in which there are two display areas. In some embodiments and referring to FIGS. 6 and 7, the display mother-substrate includes two display areas, a first display area Q11 and a second display area Q12. A cross-section of the spacer component 9 taken along line A-A' in FIG. 6 has a bottom $b_2$ close to the base substrate 10 and a top $b_1$ away from the base substrate 10; and a first side $b_3$ and a second side $b_4$ opposite to each other and connecting the top $b_1$ and the bottom $b_2$. An orthographic projection of the top $b_1$ on the base substrate 10 is denoted as a first projection V; and an orthographic projection of the bottom $b_2$ on the base substrate 10 is denoted as a second projection $b_2'$. The first projection $b_1'$ has a first end $a_1$ and a second end $a_2$, and the second projection $b_2'$ has a third end $a_3$ and a fourth end $a_4$. As illustrated in FIG. 7, the third end $a_3$ and the fourth end $a_4$ of the second projection $b_2'$ are both within the first projection $b_1'$. That is to say, an included angle between a side surface of the spacer component 9 close to the first display area Q11 and a top surface of the spacer component 9 is equal to or less than 90°, and an included angle of a side surface of the spacer component 9 close to the second display area Q12 and the top surface of the spacer component 9 is equal to or less than 90°. By having these two included angles, the encapsulation layer 8 deposited on the spacer component 9 can be made naturally discontinuous at a position between the first display area Q11 and the cutting line S and a position between the second display area Q12 and the cutting line S. Therefore, when the display mother-substrate is cut along the cutting line S to obtain the display substrates in a subsequent process, cracks generated in the encapsulation layer 8 in the non-display area Q2 will not extend to the encapsulation layer 8 in the display areas Q11 and Q12, thereby effectively improving the reliability of the display substrate obtained by the cutting.

In some embodiments and referring to FIG. 7, the top $b_1$ of the spacer component 9 is parallel to the base substrate 10. The first side $b_3$ and the second side $b_4$ of the cross-section in FIG. 7 are linear sides, an included angle between the top $b_1$ and the first side $b_3$ is less than 90°, and an included angle between the top $b_1$ and the second side $b_4$ is also less than 90°. Accordingly, an included angle between the side surface of the spacer component 9 close to the first display area Q11 and the top surface of the spacer component 9 and an included angle of the side surface of the spacer component 9 close to the second display area Q12 and the top surface of the spacer component 9 can be made sharper, thereby ensuring that the encapsulation layer 8 deposited on the spacer component 9 can be made naturally discontinuous at these positions. Moreover, the spacer component 9 having this structure can be easily fabricated.

In some embodiments, the cross-section of the spacer component 9 has the included angle between the top $b_1$ and the first side $b_3$ equal to approximately 70° and the included angle between the top $b_1$ and the second side $b_4$ equal to approximately 70°. As such, by having the included angles of 70°, the encapsulation layer 8 deposited on the spacer component 9 can be made completely and naturally discontinuous, and the spacer component 9 having this structure can also be easily fabricated.

In some embodiments, the third end $a_3$ of an orthographic projection (i.e., the second projection $b_2'$) of the base of the cross-section of the spacer component 9 is within the first projection $b_1'$, and the fourth end $a_4$ of the second projection $b_2'$ is not within the first projection $b_1'$. As such, an included angle between a side surface of the spacer component 9 close to the second display area Q12 and the top surface of the spacer component 9 is equal to or less than 90°. By having this included angle, the encapsulation layer 8 deposited on the spacer component 9 can be made naturally discontinuous at the position of the included angle. Therefore, when the display mother-substrate is cut along the cutting line S to obtain the display substrate in a subsequent process, cracks generated in the encapsulation layer 8 in the non-display area Q2 will not extend to the encapsulation layer 8 in the second display area Q12, thereby effectively improving the reliability of the display substrate corresponding to the second display area Q12 obtained by the cutting.

In some embodiments, the fourth end $a_4$ of an orthographic projection (i.e., the second projection $b_2'$) of the base of the cross-section of the spacer component 9 is within the first projection $b_1'$, and the third end $a_3$ of the second projection $b_2'$ is not within the first projection $b_1'$. As such, an included angle between a side surface of the spacer component 9 close to the first display area Q11 and the top surface of the spacer component 9 is equal to or less than 90°. By having this included angle, the encapsulation layer 8 deposited on the spacer component 9 can be made naturally discontinuous at the position of the included angle. Therefore, when the display mother-substrate is cut along the cutting line S to obtain the display substrate in a subsequent process, cracks generated in the encapsulation layer 8 in the non-display area Q2 will not extend to the encapsulation layer 8 in the first display area Q11, thereby effectively improving the reliability of the display substrate corresponding to the first display area Q11 obtained by the cutting.

In some embodiments, when the display mother-substrate includes only one display area, and a distance between the cutting line and the display area is relatively small, the spacer component and the cutting line may be provided so that an orthographic projection of the cutting line on the base substrate is within an orthographic projection of the spacer component on the base substrate. For example, the spacer component having a cross-section as illustrated in FIG. 3 or FIG. 7 may be used.

To simplify the manufacturing process, in some embodiments, the spacer component 9 may be formed in a same process as a spacer layer 7 of the display mother-substrate using a same material.

Next, the position of the spacer component will be described in conjunction with a structure of the light emitting element 6.

In some embodiments and referring to FIG. 2, the display mother-substrate includes a base substrate 10 and a pixel driving circuit on the base substrate 10. The pixel driving circuit generally includes a switch transistor, a driving transistor 1, a storage capacitor and the like. Each of the switch transistor and the driving transistor 1 includes an active layer, a gate insulation layer 2, a gate, an inter-layer insulation layer 3, a source and a drain, which are sequentially provided on the base substrate 10. The source and the drain are connected to the active layer through via holes penetrating through the inter-layer insulation layer 3 and the gate insulation layer 2, respectively. The storage capacitor may have two electrode plates, one of which is arranged in a same layer as the gate, and the other of which is arranged in a same layer as the source and the drain. A planarization layer 4 is provided on a side of the sources and drains of switch transistor and the driving transistor 1 away from the base substrate 10. The planarization layer 4 not only covers the display area Q1, but also extends to the non-display area Q2. A via hole is provided at a position in the planarization layer 4 corresponding to the drain of the driving transistor 1. A first electrode 61 of the light emitting element 6 is provided on a side of the planarization layer 4 away from the base substrate 10, and the first electrode 61 is electrically connected to the drain of the driving transistor 1 through the via hole penetrating through the planarization layer 4. A pixel definition layer 5 is provided on a side of the first electrode 61 of the light emitting element 6 away from the base substrate 10, and an accommodation portion is provided at a position in the pixel definition layer 5 corresponding to the first electrode 61 of the light emitting element 6. An organic functional layer 62 of the light emitting element 6 may be provided in the accommodation portion. That is, the light emitting element 6 may be an organic light emitting diode. The organic functional layer 62 of the light emitting element 6 may include a hole injection layer, a hole transportation layer, a light emitting layer, an electron transportation layer, and an electron injection layer, which are sequentially provided along a direction away from the base substrate 10. The spacer layer 7 and the spacer component 9 are provided on a side of the organic functional layer 62 of the light emitting element 6 away from the base substrate 10. The spacer layer 7 and the spacer component 9 may be formed by: forming a spacer material layer; forming a pattern of the spacer layer 7 in the display area Q1 and at a position corresponding to the pixel circuit through a first photolithography process; and forming a pattern of the spacer component 9 in the non-display area Q2 through a second photolithography process. A second electrode 63 of the light emitting element 6 is provided on a side of the spacer layer 7 and the spacer component 9 away from the base substrate 10, and the encapsulation layer 8 is provided on a side of the second electrode 63 of the light emitting element 6 away from the base substrate 10. The encapsulation layer 8 is discontinuous at a position between the display area Q1 and the cutting line S. The encapsulation layer 8 may include inorganic layers such as SiNx layer, SiCN layer, SiON layer and SiOx layer and the like, which are sequentially arranged on the base substrate 10.

It should be noted that the above description is give by taking an example in which the switch transistor and the driving transistor are bottom-gate type thin film transistors, but the two transistors may be top-gate type thin film transistors. Moreover, one of the first electrode 61 and the second electrode 63 of the light emitting element 6 is an anode, and the other is a cathode.

Figure 8:
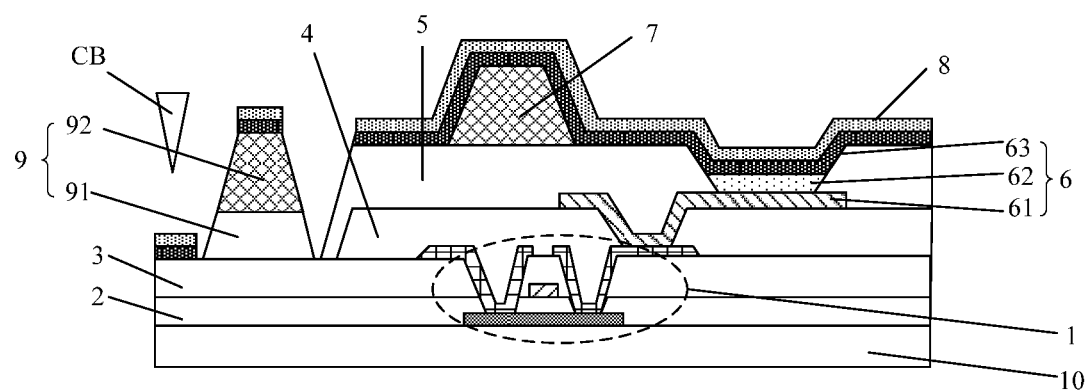
FIG. 8 is a cross-sectional view of a display mother-substrate in some embodiments according to the present disclosure.

In the embodiments of the present disclosure, the encapsulation layer 8 in the display mother-substrate can be made naturally discontinuous at a position between the display area Q1 and the cutting line S by having the spacer component 9 with a particular shape. In some embodiments, another structure of the spacer component 9 that can make the encapsulation layer 8 in the display mother-substrate naturally discontinuous at a position between the display area Q1 and the cutting line S is provided. FIG. 8 is a cross-sectional view of a display mother-substrate in some embodiments according to the present disclosure.

In some embodiments and referring to FIG. 8, the spacer component 9 is designed to have a specific height in a direction perpendicular to the base substrate 10, and the spacer component 9 can make the encapsulation layer 8 formed on the spacer component 9 naturally discontinuous at a position between the display area Q1 and the cutting line S.

As illustrated in FIG. 8, the structure of the display mother-substrate is substantially the same as that of the display mother-substrate described in the above embodiments except for the structure of the spacer component 9. As illustrated in FIG. 8, the spacer component 9 includes a first structural layer 91 and a second structural layer 92 sequentially provided along a direction away from the base substrate 10. The first structural layer 91 is provided in a same layer and having a same material as the planarization layer 4; and the second structural layer 92 is provided in a same layer and having a same material as the spacer layer 7. That is to say, the first structural layer 91 of the spacer component 9 in the non-display area Q2 is formed while forming the planarization layer 4 in the display area Q1, and the second structural layer 92 of the spacer component in the non-display area Q2 is formed while forming the spacer layer 7 in the display area Q1. The formation of the spacer component 9 having this structure does not require an additional processing step or additional cost. Needless to say, the formation of the spacer component 9 is not limited thereto. For example, the spacer component 9 having a specific height may be fabricated separately prior to the formation of the encapsulation layer 8, so that the encapsulation layer 8 that is formed subsequently can be made naturally discontinuous at a position between the display area Q1 and the cutting line S. As used herein, the term "same layer" refers to the relationship between the layers simultaneously formed in the same step. In one example, the first structural layer 91 and the planarization layer 4 are in a same layer when they are formed as a result of one or more steps of a same patterning process performed on a same material layer. In another example, the first structural layer 91 and the planarization layer 4 can be formed in a same layer by simultaneously performing the step of forming the first structural layer 91 and the step of forming the planarization layer 4. The term "same layer" does not always mean that the thickness of the layer or the height of the layer in a cross-sectional view is the same.

In another aspect, the present disclosure further provides a method of manufacturing a display mother-substrate. The method may be used for manufacturing the display mother-substrate in the above embodiments. The method includes forming a base substrate; forming a plurality of light emitting elements on the base substrate and in the display area; forming an encapsulation layer on a side of the plurality of light emitting elements away from the base substrate and in both of the display area and the non-display area to encapsulate the plurality of light emitting elements.

In some embodiments, prior to forming the encapsulation layer, the method further includes forming a spacer component in the non-display area, and the step of forming the encapsulation layer includes forming the encapsulation layer on a side of the spacer component away from the base substrate. In some embodiments, at least a part of the spacer component is formed between the cutting line and the display area, and the encapsulation layer is formed to be discontinuous at a position between the cutting line and the display area.

In some embodiments, the encapsulation layer may be formed to have a wall shape or a strip shape. In some embodiments, the spacer component is formed so that the spacer component is provided to surround the display area. As such, the encapsulation layer can be formed to be discontinuous at every position between the display area and the cutting line, thereby ensuring to the largest extent that the crack generated when cutting the encapsulation layer is prevented from extending to the display area.

In some embodiments, the encapsulation layer is formed to include a first portion in the display area and a second portion on a side of the spacer component away from the base substrate, and the first portion and the second portion are formed to be spaced apart from each other such that the encapsulation layer is discontinuous at the position between the spacer component and the display area.

In some embodiments, the spacer component is formed so that the spacer component is arranged substantially along the cutting line and substantially surrounds the display area.

In some embodiments, the spacer component is formed so that a cross-section of the spacer component along a width direction of the spacer component from the display area to the non-display area has a trapezoid shape, an inverted trapezoid shape, or a rectangular shape.

In some embodiments, the method further includes forming a spacer layer in the display area, wherein the spacer component and the spacer layer are formed by using a same material.

In some embodiments, the method further includes forming a planarization layer in the display area; and forming a spacer layer on a side of the planarization layer away from the base substrate, wherein the spacer component is formed to include a first structural layer and a second structural layer arranged sequentially along a direction from the base substrate to the encapsulation layer; the first structural layer is formed in a same layer and using a same material as the planarization layer; and the second structural layer is formed in a same layer and using a same material as the spacer layer.

Figure 9:
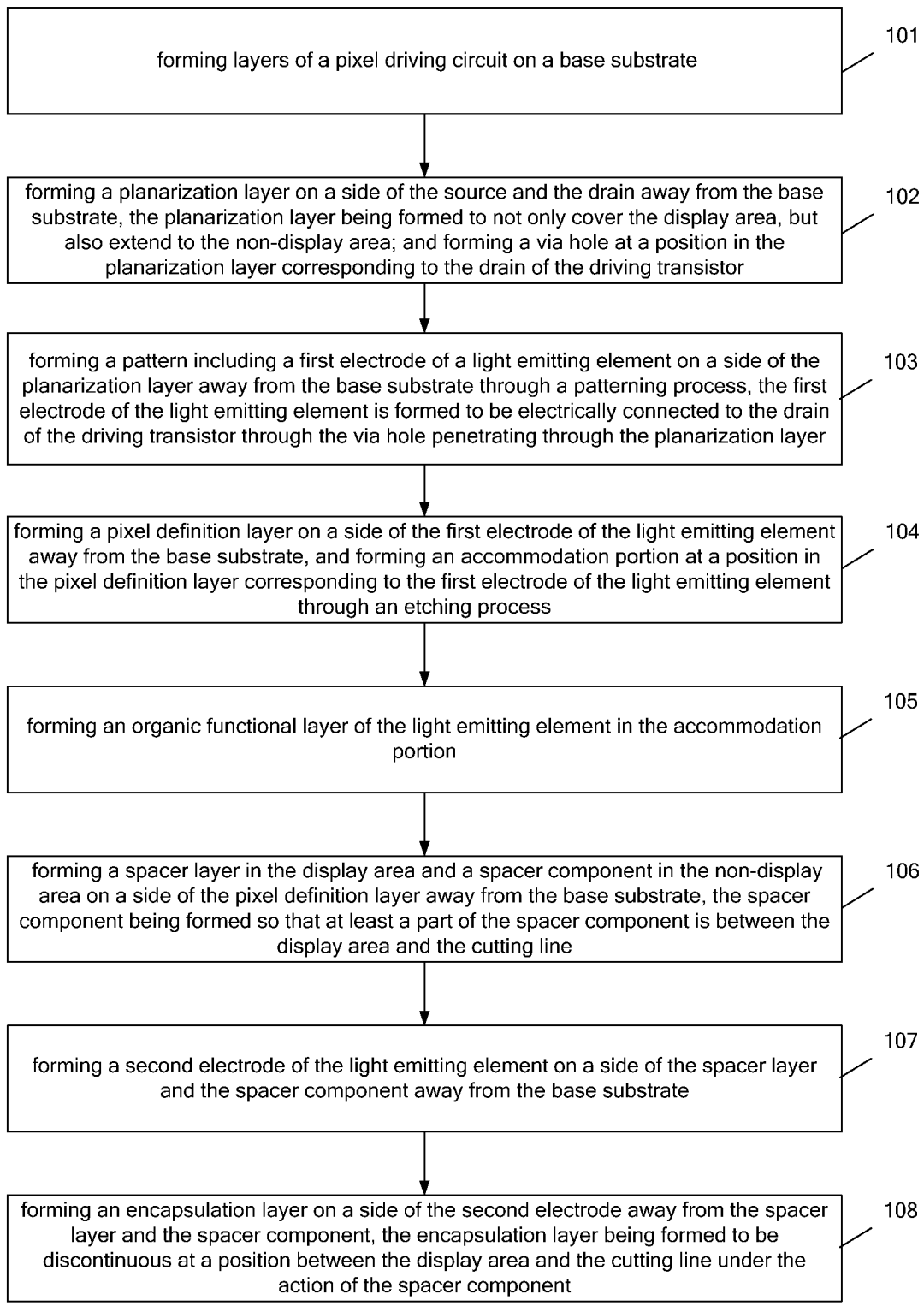
FIG. 9 is a flowchart illustrating a method of manufacturing a display mother-substrate in some embodiments according to the present disclosure.

Next, descriptions of the method will be given with reference to an example in which the cross-section of the spacer component is of an inverted trapezoid shape. FIG. 9 is a flowchart illustrating a method of manufacturing a display mother-substrate in some embodiments according to the present disclosure. As illustrated in FIG. 9 and referring to FIG. 2, the method includes steps 101 to 108.

At step 101, layers of a pixel driving circuit is formed on a base substrate 10. The pixel driving circuit generally includes a switch transistor, a driving transistor 1, a storage capacitor and the like. The manufacturing process for the switch transistor is the same as that for the driving transistor 1, thus the manufacturing process for the pixel driving circuit will be described with reference to steps for forming the driving transistor 1 only.

In an embodiment, step 101 includes forming a pattern including an active layer of the driving transistor 1 on the base substrate 10 through a patterning process; after the formation of the active layer, forming a gate insulation layer 2 on a side of the active layer away from the base substrate 10; after the formation of the gate insulation layer 2, forming a pattern including a gate and a first electrode plate of the storage capacitor through a patterning process; after the formation of the gate, forming an inter-layer insulation layer 3 on a side of the gate away from the base substrate, and forming via holes penetrating through the inter-layer insulation layer 3 and the gate insulation layer 2 through an etching process, the via hole being formed to connect a source and a drain to the active layer; forming a pattern including the source, the drain, and a second electrode plate of the storage capacitor through a patterning process, the source and the drain being connected to the active layer through the via holes penetrating through the inter-layer insulation layer 3 and the gate insulation layer 2, respectively.

At step 102, a planarization layer 4 is formed on a side of the source and the drain away from the base substrate 10, the planarization layer 4 being formed to not only cover the display area Q1, but also extend to the non-display area Q2; and a via hole is formed at a position in the planarization layer 4 corresponding to the drain of the driving transistor 1.

At step 103, a pattern including a first electrode 61 of a light emitting element 6 is formed on a side of the planarization layer 4 away from the base substrate 10 through a patterning process, the first electrode 61 of the light emitting element 6 being formed to be electrically connected to the drain of the driving transistor 1 through the via hole penetrating through the planarization layer 4.

At step 104, a pixel definition layer 5 is formed on a side of the first electrode 61 of the light emitting element 6 away from the base substrate 10, and an accommodation portion is formed at a position in the pixel definition layer 5 corresponding to the first electrode 61 of the light emitting element 6 through an etching process.

At step 105, an organic functional layer 62 of the light emitting element 6 is formed in the accommodation portion. As an example, a hole injection layer, a hole transportation layer, a light emitting layer, an electron transportation layer, and an electron injection layer may be sequentially formed along a direction away from the base substrate 10 through an evaporation process.

At step 106, a spacer layer 7 in the display area Q1 and a spacer component 9 in the non-display area Q2 are formed on a side of the pixel definition layer 5 away from the base substrate 10. The spacer component 9 may be formed so that at least a part of the spacer component 9 is between the display area Q1 and the cutting line S.

In an embodiment, step 106 includes forming a spacer material layer on a side of the pixel definition layer 5 away from the base substrate 10; forming a pattern including the spacer layer 7 in the display area Q1 through a first photolithography process; and forming a pattern of the spacer component 9 in the non-display area Q2 through a second photolithography process. The spacer component 9 is formed so that a cross-section of the spacer component 9 in a width direction thereof from the display area to the non-display area has an inverted trapezoid shape. As such, the manufacturing process can be simplified.

The spacer component 9 having the inverted trapezoid shape may be formed by forming a positive photoresist on the spacer material layer in the display area Q1, forming a negative photoresist on the spacer material layer in the non-display area Q2 (the photoresist in these two areas is exchangeable), and then forming the spacer layer 7 and the spacer component 9 by a photolithography process, respectively. Here, during an exposure process performed on the spacer component 9, a side of the spacer component 9 away from the photoresist is exposed and the an etching process is performed to form the spacer component 9 having the inverted trapezoid shape. Alternatively, the spacer component 9 having the inverted trapezoid shape may be formed by controlling process conditions such as temperature, etching duration and etching rate.

In some embodiments, the spacer component 9 and the spacer layer 7 may be not formed by one patterning process but be separately formed by two patterning processes, respectively. As such, the cross-section of the spacer component 9 can have an inverted trapezoid shape by selecting a material for the spacer component 9.

At step 107, a second electrode 63 of the light emitting element 6 is formed on a side of the spacer layer 7 and the spacer component 9 away from the base substrate 10.

At step 108, an encapsulation layer 8 is formed on a side of the second electrode 63 away from the spacer layer 7 and the spacer component 9. The encapsulation layer 8 is formed to be naturally discontinuous at a position between the display area Q1 and the cutting line S under the action of the spacer component 9.

Step 108 may include forming the encapsulation layer 8 on the base substrate 10 having the light emitting element 6 formed thereon by low temperature chemical vapor deposition. A material for forming the encapsulation layer 8 includes, but is not limited to, at least one of SiNx, SiCN, SiON, and SiOx.

To this end, the manufacturing process of the display mother-substrate is completed.

In the method of manufacturing the display mother-substrate of the present embodiment, by forming the spacer component 9 between the base substrate 10 and the encapsulation layer 8 in the non-display area Q2 of the display mother-substrate, the encapsulation layer 8 can be made discontinuous between the display area Q1 and the cutting line S. For example, during formation of the encapsulation layer 8 after the formation of the spacer component 9, the encapsulation layer 8 is naturally discontinuous at an edge of the spacer component 9 due to the presence of the spacer component 9, and a discontinuous encapsulation layer is thus formed. Accordingly, before cutting the display mother-substrate, the encapsulation layer 8 of the display mother-substrate is already discontinuous at a position between the display area Q1 and the cutting line S. Therefore, when the display mother-substrate is cut along the cutting line S to obtain the display substrate in a subsequent process, cracks generated in the encapsulation layer 8 in the non-display area Q2 caused by the cutting will not extend to the encapsulation layer 8 in the display area Q1, thereby effectively improving the reliability of the display substrate obtained by the cutting.

In the embodiments of the present disclosure, the encapsulation layer 8 in the display mother-substrate can be made naturally discontinuous at a position between the display area Q1 and the cutting line S by having the spacer component 9 with a particular shape. In some embodiments, another method of manufacturing a display mother-substrate, which can make the encapsulation layer 8 in the display mother-substrate naturally discontinuous at a position between the display area Q1 and the cutting line S, is provided.

This method is different from the above method in that the spacer component is formed in a different manner.

As discussed above, in some embodiments, the spacer component 9 is designed to have a specific height in a direction perpendicular to the base substrate 10 so that the encapsulation layer 8 formed on the spacer component 9 can be made naturally discontinuous at a position between the display area Q1 and the cutting line S.

In an embodiment, the spacer component 9 having the specific height includes a first structural layer 91 and a second structural layer 92 sequentially formed along a direction away from the base substrate 10. The first structural layer 91 is provided in a same layer and having a same material as the planarization layer 4; and the second structural layer 92 is provided in a same layer and having a same material as the spacer layer 7. That is to say, in the method of manufacturing the display mother-substrate, the first structural layer 91 of the spacer component 9 in the non-display area Q2 is formed while forming the planarization layer 4 in the display area Q1, and the second structural layer 92 of the spacer component 9 in the non-display area Q2 is formed while forming the spacer layer 7 in the display area Q1. The formation of the spacer component 9 having this structure does not require an additional processing step or additional cost. Needless to say, the formation of the spacer component 9 is not limited thereto. For example, the spacer component 9 having a specific height may be fabricated separately prior to the formation of the encapsulation layer 8, so that the encapsulation layer 8 that is formed subsequently can be made naturally discontinuous at a position between the display area Q1 and the cutting line S.

In another aspect, the present disclosure further provides a display substrate, which can be obtained by cutting a display mother-substrate along a cutting line, the display mother-substrate is a display mother-substrate described herein or manufactured by a method described herein.

In another aspect, the present disclosure further provides a display apparatus including a display substrate, which can be obtained by cutting a display mother-substrate along a cutting line, the display mother-substrate is a display mother-substrate described herein or manufactured by a method described herein.

The display apparatus may include, but is not limited to, any product or part having a display function such as an OLED panel, a mobile phone, a tablet computer, a television, a display, a laptop computer, a digital photo frame, a navigator or the like.

By having the display substrate described above, the display panel has an improved reliability.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present invention, and these variations and improvements shall also fall into the protection scope of the present disclosure.

What is claimed is:

1. A display mother-substrate configured to be cut along a cutting line to obtain a display substrate, the display mother substrate having a display area and a non-display area, the display mother-substrate comprising:
    a base substrate;
    a plurality of light emitting elements on the base substrate and in the display area;
    an encapsulation layer for encapsulating the plurality of the light emitting elements on a side of the plurality of light emitting elements away from the base substrate and in both of the display area and the non-display area; and
    a spacer component in the non-display area and on a side of the encapsulation layer close to the base substrate; wherein
    at least a part of the spacer component is between the cutting line and the display area, and
    the encapsulation layer is discontinuous at a position between the cutting line and the display area,
    wherein an orthographic projection of the cutting line on the base substrate is within an orthographic projection of the spacer component on the base substrate.

2. The display mother-substrate of claim 1, wherein the encapsulation layer comprises a first portion in the display area and a second portion on a side of the spacer component away from the base substrate, and
    the first portion and the second portion are spaced apart from each other such that the encapsulation layer is discontinuous at a position between the spacer component and the display area.

3. The display mother-substrate of claim 1, wherein the spacer component is arranged substantially along the cutting line and substantially surrounds the display area.

4. The display mother-substrate of claim 1, wherein a cross-section of the spacer component along a width direction of the spacer component from the display area to the non-display area has a trapezoid shape, an inverted trapezoid shape, or a rectangular shape.

5. A display mother-substrate configured to be cut along a cutting line to obtain a display substrate, the display mother substrate having a display area and a non-display area, the display mother-substrate comprising:
    a base substrate;
    a plurality of light emitting elements on the base substrate and in the display area;
    an encapsulation layer for encapsulating the plurality of the light emitting elements on a side of the plurality of light emitting elements away from the base substrate and in both of the display area and the non-display area; and
    a spacer component in the non-display area and on a side of the encapsulation layer close to the base substrate, wherein
    at least a part of the spacer component is between the cutting line and the display area, and
    the encapsulation layer is discontinuous at a position between the cutting line and the display area,
    wherein an orthographic projection of the cutting line on the base substrate is outside an orthographic projection of the spacer component on the base substrate.

6. The display mother-substrate of claim 5, wherein the encapsulation layer is discontinuous at a position between the spacer component and the cutting line.

7. The display mother-substrate of claim 1, further comprising a spacer layer in the display area, wherein the spacer component and the spacer layer are made of a same material.

8. The display mother-substrate of claim 1, further comprising:
    a planarization layer in the display area; and
    a spacer layer on a side of the planarization layer away from the base substrate,
    wherein the spacer component comprises a first structural layer and a second structural layer arranged sequentially along a direction from the base substrate to the encapsulation layer;
    the first structural layer and the planarization layer are in a same layer and made of a same material; and
    the second structural layer and the spacer layer are in a same layer and made of a same material.

9. The display mother-substrate of claim 4, wherein the cross-section has a bottom close to the base substrate and a top away from the base substrate;
    an orthographic projection of the top on the base substrate has a first end and a second end; and
    an orthographic projection of the bottom on the base substrate has a third end and a fourth end;
    wherein at least one of the third end and the fourth end is between the first end and the second end.

10. The display mother-substrate of claim 9, wherein the cross-section further has a first side and a second side opposite to each other and connecting the top and the bottom; wherein the top is substantially parallel to the base substrate; and
    at least one of a first included angle between the top and the first side and a second included angle between the top and the second side is less than 90°.

11. The display mother-substrate of claim 1, wherein the display mother-substrate has a plurality of the display areas, and the spacer component between adjacent display areas is of an integral structure.

12. A method of manufacturing a display mother-substrate, the display mother-substrate being configured to be cut along a cutting line to obtain a display substrate, the display mother substrate having a display area and a non-display area, the method comprising:
    forming a base substrate;
    forming a plurality of light emitting elements on the base substrate and in the display area;
    forming an encapsulation layer on a side of the plurality of light emitting elements away from the base substrate and in both of the display area and the non-display area, the encapsulation layer in the display area being formed to encapsulate the plurality of light emitting elements;

wherein prior to forming the encapsulation layer, the method further comprises forming a spacer component in the non-display area and on a side of the encapsulation layer to be formed close to the base substrate;

at least a part of the spacer component is formed between the cutting line and the display area; and the encapsulation layer is formed to be discontinuous at a position between the cutting line and the display area;

wherein an orthographic projection of the cutting line on the base substrate is either completely within or outside an orthographic projection of the spacer component on the base substrate.

13. The method of claim 12, wherein the encapsulation layer is formed to include a first portion in the display area and a second portion on a side of the spacer component away from the base substrate, and the first portion and the second portion are formed to be spaced apart from each other such that the encapsulation layer is discontinuous at a position between the spacer component and the display area.

14. The method of claim 12, wherein the spacer component is formed so that the spacer component is arranged substantially along the cutting line and substantially surrounds the display area.

15. The method of claim 12, wherein the spacer component is formed so that a cross-section of the spacer component along a width direction of the spacer component from the display area to the non-display area has a trapezoid shape, an inverted trapezoid shape, or a rectangular shape.

16. The method of claim 12, further comprising forming a spacer layer in the display area, wherein the spacer component and the spacer layer are formed by using a same material.

17. The method of claim 12, further comprising:

forming a planarization layer in the display area; and forming a spacer layer on a side of the planarization layer away from the base substrate;

wherein the spacer component is formed to comprise a first structural layer and a second structural layer arranged sequentially along a direction from the base substrate to the encapsulation layer;

the first structural layer and the planarization layer are formed in a same layer by using a same material; and the second structural layer and the spacer layer are formed in a same layer by using a same material.

18. A display substrate, obtained by cutting the display mother-substrate of claim 1 along the cutting line.

19. A display apparatus, comprising the display substrate of claim 18.

20. A display substrate, obtained by cutting the display mother-substrate of claim 5 along the cutting line.

* * * * *